United States Patent
Karner et al.

(10) Patent No.: US 9,919,665 B2
(45) Date of Patent: Mar. 20, 2018

(54) DEVICE AND METHOD FOR MONITORING A TIMER

(71) Applicant: Robert Bosch GmbH, Stuttgart (DE)

(72) Inventors: Ruediger Karner, Kornwestheim (DE); Hartmut Schumacher, Freiberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/104,749

(22) PCT Filed: Dec. 8, 2014

(86) PCT No.: PCT/EP2014/076896
§ 371 (c)(1),
(2) Date: Aug. 15, 2016

(87) PCT Pub. No.: WO2015/091059
PCT Pub. Date: Jun. 25, 2015

(65) Prior Publication Data
US 2016/0339856 A1     Nov. 24, 2016

(30) Foreign Application Priority Data
Dec. 18, 2013   (DE) .................. 10 2013 226 429

(51) Int. Cl.
*B60R 16/03*     (2006.01)
*G06F 11/07*     (2006.01)
*H03K 5/26*      (2006.01)
*G06F 1/04*      (2006.01)

(52) U.S. Cl.
CPC .............. *B60R 16/03* (2013.01); *G06F 1/04* (2013.01); *G06F 11/0739* (2013.01); *G06F 11/0757* (2013.01); *H03K 5/26* (2013.01)

(58) Field of Classification Search
CPC .................................. B60R 16/03; H03K 5/26
USPC ..................... 377/3, 19, 20, 45; 701/36, 45
See application file for complete search history.

(56) References Cited

U.S. PATENT DOCUMENTS

| | | | |
|---|---|---|---|
| H001793 H * | 4/1999 | Peterson ................. | 323/367 |
| 7,064,694 B1 | 6/2006 | Male et al. | |
| 7,616,021 B2 * | 11/2009 | Papageorgiou .... | G01R 31/2884 |
| | | | 324/762.01 |
| 7,884,678 B2 * | 2/2011 | Tasher ................ | H03K 4/501 |
| | | | 331/108 D |
| 2005/0228562 A1 | 10/2005 | Sayama et al. | |

FOREIGN PATENT DOCUMENTS

| | | |
|---|---|---|
| JP | H0552945 U | 7/1993 |
| JP | H07141225 A | 6/1995 |
| JP | 2013190853 A | 9/2013 |

OTHER PUBLICATIONS

International Search Report dated Feb. 16, 2015 for International Application No. PCT/EP2014/076896.

* cited by examiner

*Primary Examiner* — Dinh T Le
(74) *Attorney, Agent, or Firm* — Norton Rose Fulbright US LLP; Gerard Messina

(57) ABSTRACT

A device and method for monitoring a timer, in particular a device for operating a passenger protection arrangement for a vehicle, the timer being configured for generating a periodic clock signal. The device includes a monitoring arrangement to monitor a pulse duration of the clock signal and consequently the pulse duration of the clock signal is monitored.

12 Claims, 5 Drawing Sheets

DEVICE AND METHOD FOR MONITORING A TIMER

FIELD OF THE INVENTION

The present invention creates a device for monitoring a timer; a corresponding method as well as a control unit including the device for carrying out the method.

BACKGROUND INFORMATION

Previous safety systems in vehicles include a multi-stage monitoring component, called a watchdog. In this connection, a differentiation may be made between hardware and software watchdogs.

In a first stage, a watchdog monitors the frequency of the system timer, which a microprocessor (μC) derived by, for example, frequency division from its own interface timer, synchronously provides to additional internal or external, electrical, electronic or digital modules.

In further stages, "queries" of the watchdog to the microprocessor must be answered correctly. Queries may be understood to be, for example, requests as well as certain arithmetic tasks. The microprocessor resources necessary for answering the queries may be assembled individually, in particular, from the microprocessor functions used in the application in the corresponding program level. The programming of the watchdog request further ensures that the queries may only be responded to correctly if the application program sequence is correct. Watchdog stages must therefore be configured for each program level (real time program, background program, etc.).

In a more stringent variant, the correct responses of the microprocessor to the individual watchdog stages (real time program, background program, etc.) must be given within a predefined time window.

Systems which must make decisions very quickly, i.e., in particular in less than 2 milliseconds, for example, systems for activating a passenger protection arrangement for a vehicle, must detect errors which result in a malfunction (i.e., for example, unintentional triggering of the passenger protection arrangement) in good time. This occurs today using frequency monitoring of the system timer of the microprocessor with the aid of a watchdog. As a result of this, each defect of the oscillator in the microprocessor is detected. In this case, the oscillator may be present in the form of a quartz or resonator.

SUMMARY OF THE INVENTION

The present invention describes the additional monitoring of the duty cycle of the system timer with the aid of a hardware watchdog.

This has the advantage that errors, which may result in a change of the pulse duration of the duty cycle, such as the attenuation of the signal of the system timer on the transmission path from the signal generator, typically from the microprocessor to connected hardware modules (for example, ASIC, interface modules and the like) having redundant functions (for example, a multi-channel interface to external sensors), are not able to result in a malfunction of individual or multiple ones of the connected modules and thus possibly of the overall system.

This is in particular important if the connected hardware modules use both the rising and falling edge of the signal of the external system timer in their digital state machines, data transfer functions, scanning units and the like.

According to the present invention, this is achieved by the features of the descriptions herein. Advantageous refinements and embodiments arise from the further descriptions herein.

For this purpose, the device according to the present invention includes an arrangement for monitoring a pulse duration of a clock signal. The monitored clock signal originates from a timer, in particular for a device for operating passenger protection arrangement for a vehicle, which generates a periodic clock signal. The additional monitoring of the pulse duration of the clock signal is, among other things, important if digital modules use both the rising and the falling edge of the clock signal for providing their functionality.

The pulse duration is the time which elapses between a rising and a falling edge of the generated clock signal.

In one advantageous embodiment of the present invention, the device generates a blocking signal as a function of the monitoring, in particular for blocking the passenger protection arrangement.

This advantageous embodiment of the present invention effectively prevents a malfunction, such as the activation of passenger protection arrangement, from endangering persons or property, when an error occurs.

Advantageously, the device includes an arrangement for detecting the pulse duration. The arrangement for detecting the pulse duration may include a counter. The counter is clocked with the aid of a separate timer and detects the time duration between the rising and the falling edge of the periodic clock signal to be monitored, for example, by starting a counter (for example, using a rising edge) or stopping the counter (for example, using a falling edge) of the clock signal to be monitored. After the end of a pulse length, the counter content is compared with at least one threshold value. In one advantageous embodiment, the counter content is compared with one predetermined upper threshold value and one predetermined lower threshold value. The at least one threshold value is dependent on the normalized, expected pulse duration of the timer.

This makes it possible to achieve a monitoring of the timer in a simple and cost-effective manner.

In one alternative specific embodiment, the device includes at least one capacitor and one comparator, in particular a window comparator, for detecting the pulse duration.

This advantageous design makes a simple and cost-effective embodiment of the present invention possible. The use of simple electronic components (capacitor and comparator or window comparator) results in a robust device.

This alternative specific embodiment is based on comparing the charging level of the capacitor with at least one reference voltage with the aid of at least one comparator. In one advantageous design of this specific embodiment, the comparator is a window comparator, which compares the charging level of the at least one capacitor with at least two reference voltages. Here, the two reference voltages represent, for example, a lower expected charging level and an upper expected charging level of the capacitor. Beginning with, for example, the rising edge of the clock signal of the timer to be monitored, the at least one capacitor is charged and immediately discharged at the beginning of the pulse pause. The position of the comparator or window comparator, which indicates whether the charge state of the reference capacitor (equivalence to pulse duration) lies below or above a level to be expected (reference voltage) or within or outside of a monitoring window, formed by two reference voltages, is stored using the falling edge of the clock signal of the timer. If the charging level of the reference capacitor with reference to the at least one threshold value (reference voltage) is at the expected level, the pulse duration has the expected minimum length and the monitoring of the timer has a positive result with reference to the minimum length of the pulse duration.

If the charging level of the reference capacitor is within the monitoring band predefined by an upper reference voltage and a lower reference voltage, the pulse duration is within the upper and lower monitoring limits and the monitoring of the timer has a positive result with reference to the pulse duration.

The implementation of the present invention with the aid of a method is significant. The method according to the present invention may be implemented with the aid of a control element, which is in particular provided for a device for the operation of a passenger protection arrangement of a vehicle. In the process, a program is stored on the control element which is runnable on a computer, in particular on a microprocessor or signal processor, and is suitable for carrying out the method according to the present invention. In this case, the present invention is thus implemented by a program stored on the control element, so that this control element provided with the program represents the present invention in the same way as the method which the program is suitable for carrying out. An electronic storage medium, for example, a read-only memory, may be used as the control element.

Exemplary embodiments of the present invention will be elucidated below with reference to the drawings.

DETAILED DESCRIPTION

Figure 1:
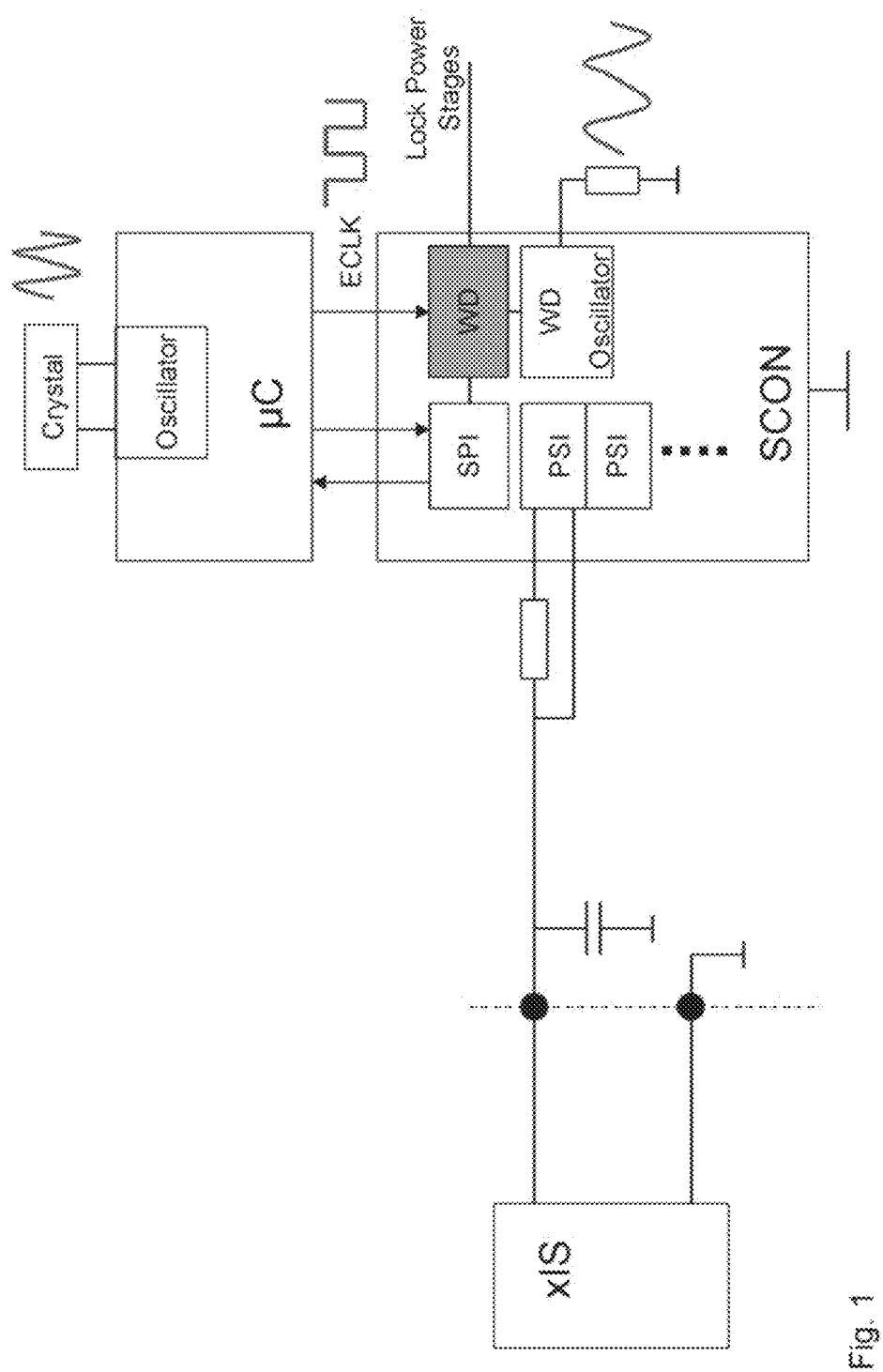
FIG. 1 shows a block diagram of a device including a timer.

FIG. 1 shows a block diagram of a device including a timer. In the specific embodiment shown, the timer oscillator is situated in a microcontroller µC. The timer oscillator converts the mechanical oscillations of the crystal (for example, quartz or alternatively resonator) into an electrical oscillation and in so doing generates a base frequency, called a base clock. From this base clock, a clock signal ECLK is formed, for example, by frequency division. This clock signal is often called an external clock. Microcontroller µC forwards clock signal ECLK formed in this manner to connected digital modules, for example, to a safety module SCON for synchronous digital control. In the specific embodiment shown, safety module SCON includes interfaces, for example, SPI, PSI and a hardware watchdog WD. The hardware watchdog also has a timer WD oscillator, for example, an RC-oscillator, which defines its frequency via an external resistor to ground. Hardware watchdog WD moreover includes functions for blocking the triggering of passenger protection arrangement (lock power stages). External sensors xIS are connected to interfaces PSI. In this case, the x may be replaced by, for example, S or F, then resulting in SIS=side impact sensor and FIS=front impact sensor.

Figure 2:
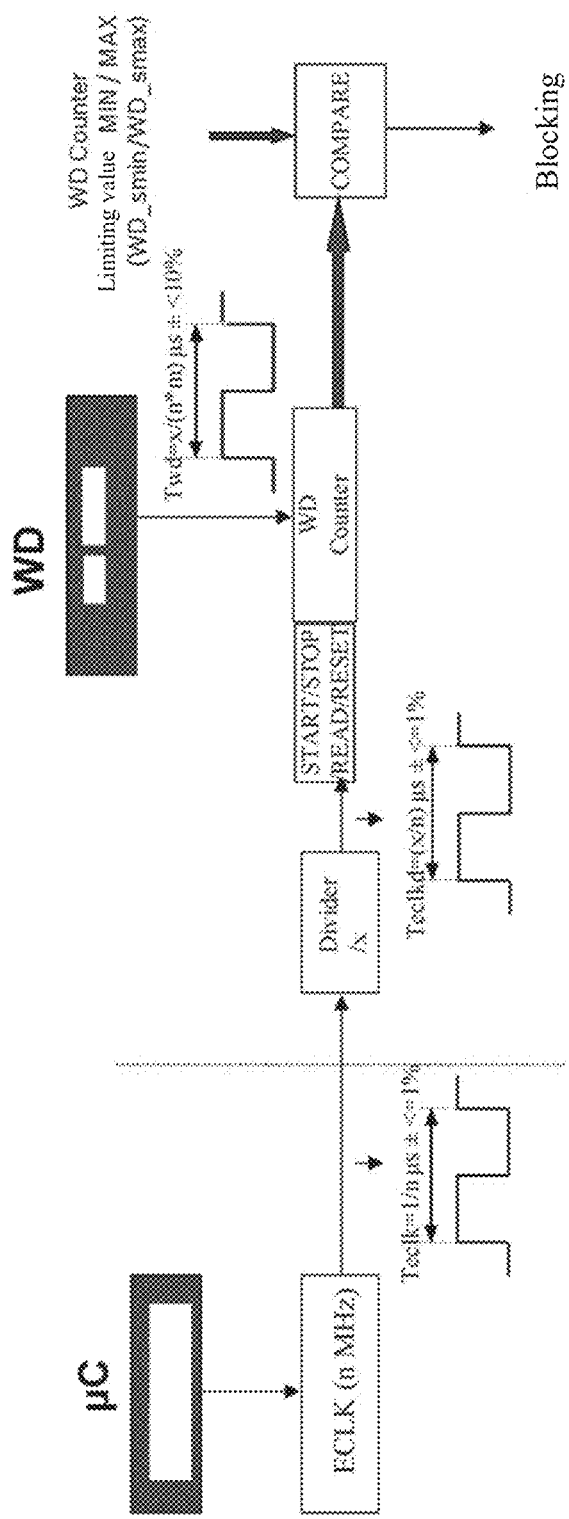
FIG. 2 shows a block diagram of a device for checking a timer according to the related art.

A block diagram of a device for checking a timer according to the related art is shown in FIG. 2. The timer to be checked is internal timer µC clock of microcontroller µC. Internal timer µC clock outputs a periodic clock signal ECLK derived from its timer (for example, a quartz, resonator, and the like) having a frequency of, for example, n MHz. Clock signal ECLK to be checked having a certain period duration Teclk is supplied to a monitoring device WD. This monitoring device normally has a prescaler divider in order to adapt clock signal ECLK in a suitable manner to the general conditions of monitoring device WD (for example, with respect to maximum processing speed, etc.). The prescaler divider may normally assume values from 1 through 1024. If the value is set to 1, monitoring device WD is at maximum sensitivity. Period duration Teclkd of clock signal ECLK divided by prescaler divider and called ECLKd, is subsequently measured using a WD counter, which is clocked by a reference oscillator WD CLOCK. In the present exemplary embodiment, period duration Twd of the WD counter is dependent on the expected period duration of the timer. The WD counter includes a processing logic having the functions START for starting the WD counter, STOP for stopping the WD counter, RESET for resetting the WD counter and READ for reading the counter content of the WD counter. After each ECLKd period, a comparison (COMPARE) is carried out of the counter content with an upper (WD_smax) and lower (WD_smin) limiting value. The limiting values are present in an appropriately configured storage unit or are hard wired in the device. Thereupon, the counter is reset (RESET) and restarted (START). If the counter content lies outside of a monitoring band for divided clock signal ECLKd, safety-relevant functions may be blocked.

Figure 3:
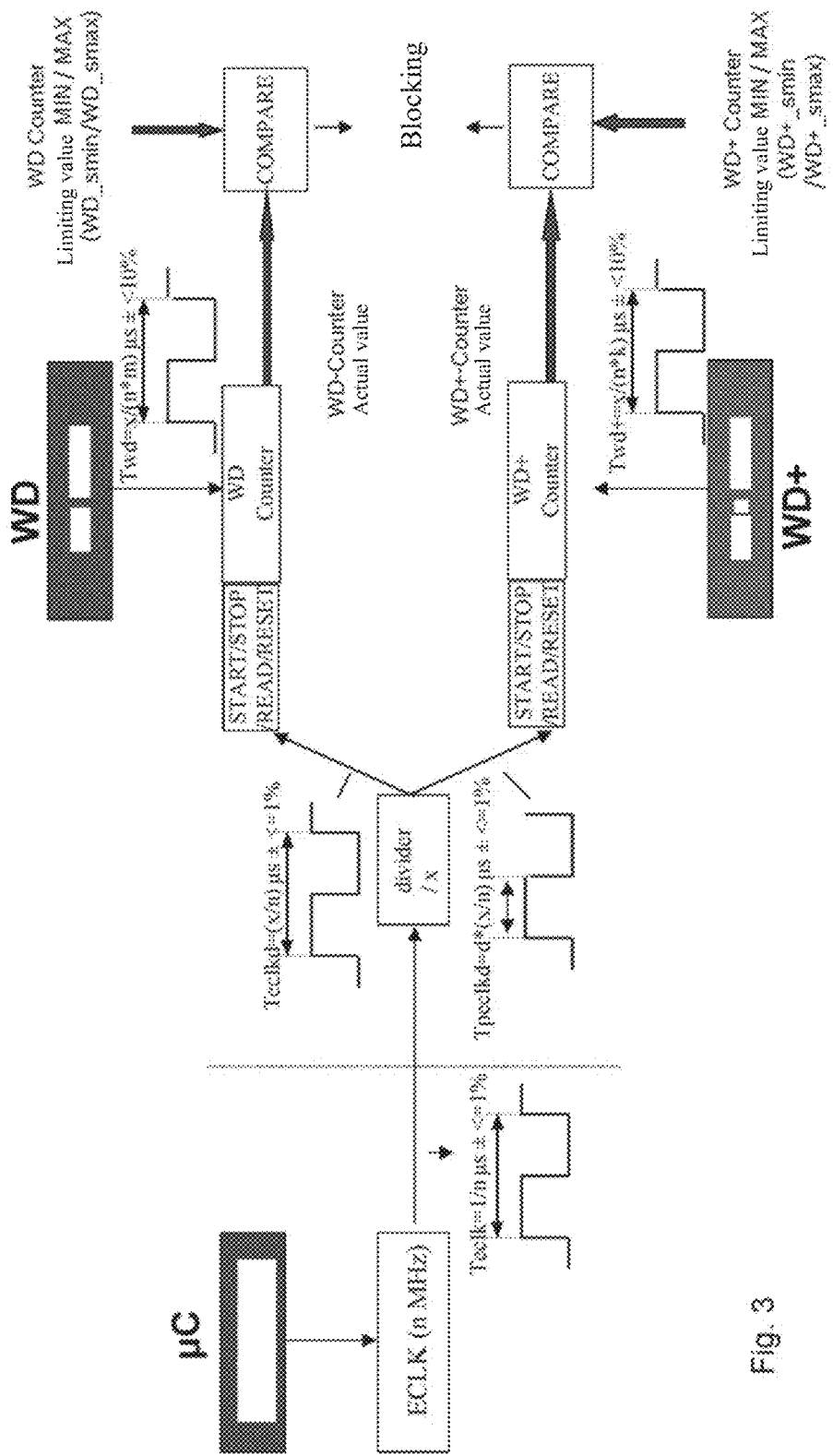
FIG. 3 shows a block diagram of a first specific embodiment of the device according to the present invention for checking a timer.

A block diagram of one specific embodiment of the device according to the present invention for monitoring a timer WD+ (=period duration-watchdog+pulse duration-watchdog) is represented in FIG. 3. In addition to the related art (period duration), the pulse duration of clock signal ECLK is measured. The pulse duration is the time which elapses between a rising and a falling edge of the clock signal.

For this purpose, pulse duration Tpelckd of divided clock signal ECLKd is measured using a counter, which is clocked by a reference oscillator using frequency WD+. After each ECLKd pulse duration, a COMPARE (read) is carried out of the counter content using an upper and lower limiting value, which defines a tolerance band (WD+_smin, WD+_smax) around the expected pulse duration Tpeclkd. Thereupon, the WD counter is reset (RESET) and restarted, according to the specific embodiment shown, using the next positive edge.

If the counter content of the WD+ counter lies within the monitoring band for pulse duration Tpeclkd and likewise the content of the WD counter is within its monitoring band for period duration Teclkd, no blocking of safety-relevant functions takes place, since the frequency and the pulse duration and accordingly the duty cycle (=duty cycle=pulse duration/period duration) of the timer are in order.

Figure 4:
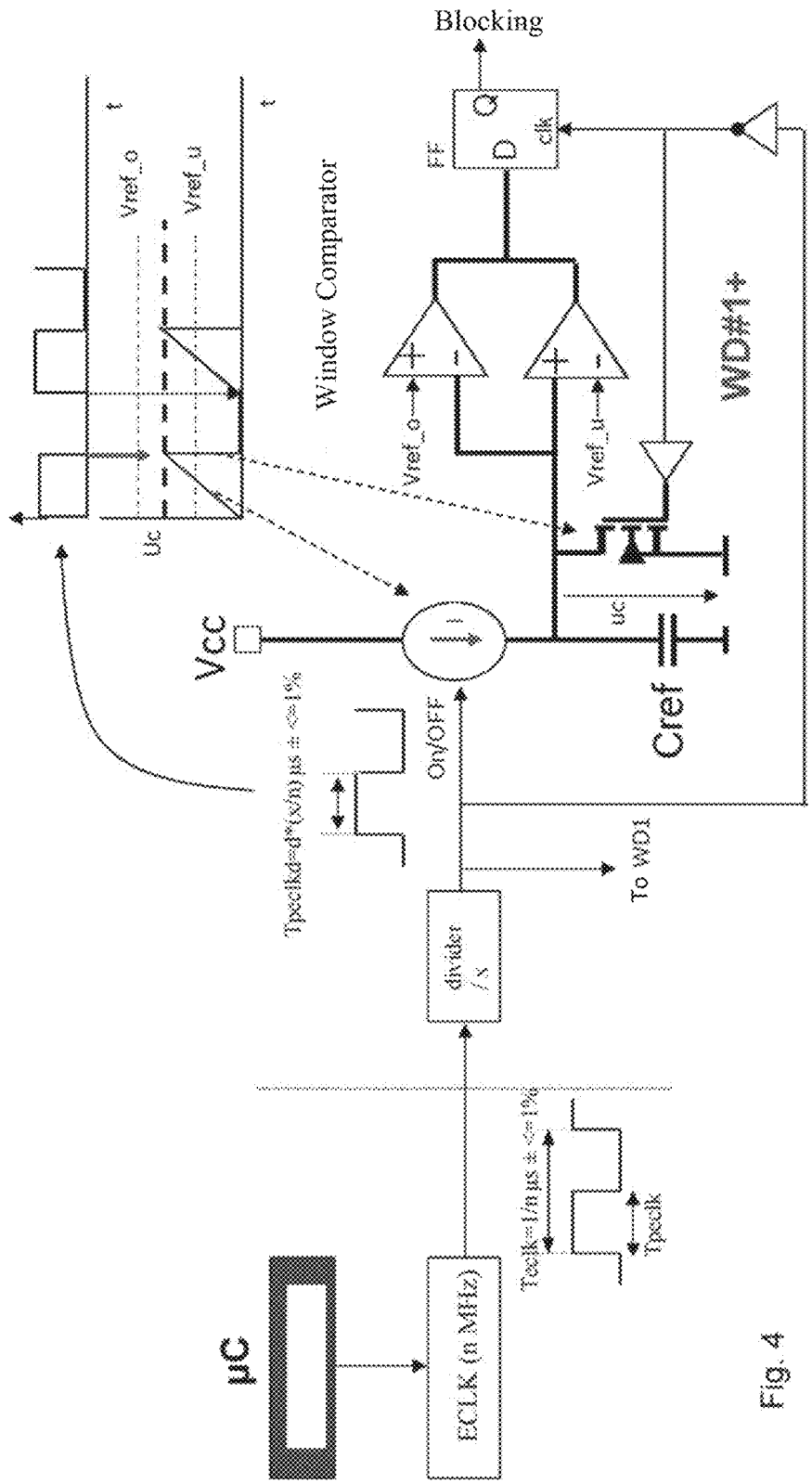
FIG. 4 shows a block diagram of an alternative specific embodiment of the device according to the present invention for checking a timer.

A block diagram of an alternative specific embodiment of the device according to the present invention for checking a timer is shown in FIG. 4.

In this case, a capacitor Cref is charged linearly using a constant current I during the ECLKd high phase and is discharged hard (fast) at the beginning of the ECLKd pulse pause.

Using a window comparator, voltage uc at capacitor Cref is checked for position in the band between Vref_u and Vref_o. Vref_u stands for a minimum lower charging level and Vref_o stands for a maximum upper charging level of the capacitor. The state at the point in time of the falling pulse edge of the ECLKd signal is stored in a flip-flop FF (in the band: Q=1, outside of the band: Q=0). If voltage uc of capacitor Cref at the point in time of the falling pulse edge is outside of the band, the pulse duration of clock signal ECLK of the timer is not correct, and consequently the duty cycle=pulse duration/period duration=duty cycle is not correct even with the proper frequency of clock signal ECLK. The frequency of the clock signal is, for example, monitored using the device for monitoring a timer known from the related art (see FIG. 1) and is not shown in FIG. 4.

Figure 5:
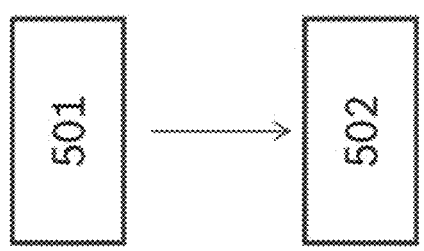
FIG. 5 shows a schematic flow chart of the method according to the present invention.

A schematic flow chart of the method according to the present invention is shown in FIG. 5. A clock signal is generated by timer μC clock in step 501. The pulse duration of the clock signal is monitored in step 502.

What is claimed is:

1. A device for monitoring a timer of a microcontroller, the timer being configured to generate a periodic clock signal, comprising:
a monitoring arrangement, which is a hardware watchdog, to monitor a pulse duration of the periodic clock signal, which includes a counter for detecting the pulse duration and a comparator; and
a reference timer to operate the counter;
wherein the pulse duration is the time which elapses between a rising edge and a falling edge of the periodic clock signal,
wherein the counter is clocked with the reference timer and detects the pulse duration between the rising edge and the falling edge of the periodic clock signal to be monitored, and
wherein if the content of the counter lies outside of the monitoring band for the pulse duration, then the blocking signal is output to block the safety-relevant function, since the pulse duration of the timer is incorrect.

2. The device of claim 1, wherein the timer is for activating a passenger protection arrangement for a vehicle.

3. The device of claim 1, wherein the comparing arrangement compares the pulse duration from the counter with at least one threshold value.

4. A device for monitoring a timer, which is configured to generate a periodic clock signal, comprising:
a monitoring arrangement, which is a hardware watchdog, to monitor a pulse duration of the periodic clock signal, wherein the apparatus includes a counter for detecting the pulse duration of the periodic clock signal;
wherein the counter for detecting the pulse duration includes at least one capacitor and at least one comparator, which are configured to form a comparator arrangement, wherein the at least one comparator is for comparing a charging level of the at least one capacitor with at least one reference voltage,
wherein the pulse duration is the time which elapses between a rising edge and a falling edge of the periodic clock signal,
wherein the counter is clocked with a reference timer and detects the pulse duration between the rising edge and the falling edge of the periodic clock signal to be monitored, and
wherein if the content of the counter lies outside of the monitoring band for the pulse duration, then the blocking signal is output to block the safety-relevant function, since the pulse duration of the timer is incorrect.

5. A device for monitoring a timer, which is configured to generate a periodic clock signal, comprising:
a monitoring arrangement to monitor a pulse duration of the periodic clock signal; and
a comparing arrangement to compare the pulse duration from the monitoring arrangement with at least one threshold value;
wherein the comparing arrangement subsequently generates a blocking signal for blocking the activation of the passenger protection arrangement as a function of the monitoring if the pulse duration lies below a lower threshold value or above an upper threshold value, which form a monitoring band,
wherein the pulse duration is the time which elapses between a rising edge and a falling edge of the periodic clock signal,
wherein the counter is clocked with a reference timer and detects the pulse duration between the rising edge and the falling edge of the periodic clock signal to be monitored, and
wherein if the content of the counter lies outside of the monitoring band for the pulse duration, then the blocking signal is output to block the safety-relevant function, since the pulse duration of the timer is incorrect.

6. A method for monitoring a timer of a microcontroller, the timer being for generating a periodic clock signal, the method comprising:
monitoring a pulse duration of the periodic clock signal with a reference capacitor coupled to a window comparator;
wherein the pulse duration is the time which elapses between a rising edge and a falling edge of the periodic clock signal,
wherein the pulse duration is detected as a function of a state of the reference capacitor coupled to the window comparator.

7. The method of claim 6, wherein the timer is for activating a passenger protection arrangement for a vehicle, and wherein a blocking signal is generated for blocking the activation of the passenger protection arrangement as a function of the monitoring.

8. The method of claim 6, wherein the pulse duration is detected with the reference capacitor.

9. The method of claim 6, wherein the pulse duration is compared with at least one threshold value, wherein the window comparator compares a charging level of the reference capacitor, which is used to detect the pulse duration, with at least one reference voltage.

10. A method for monitoring a timer of a microcontroller, the timer being for generating a periodic clock signal, the method comprising:
monitoring, via a hardware watchdog, a pulse duration of the periodic clock signal;
wherein the timer is for activating a passenger protection arrangement for a vehicle, and wherein a blocking signal is generated by a comparator for blocking the activation of the passenger protection arrangement as a function of the monitoring,
wherein the comparator generates the blocking signal for blocking the activation of the passenger protection arrangement as a function of the monitoring is subsequently generated if the pulse duration lies below a lower threshold value or above an upper threshold value, which form a monitoring band, and
wherein the pulse duration is the time which elapses between a rising edge and a falling edge of the periodic clock signal.

11. A control unit, comprising:
a device for monitoring a timer of a microcontroller, the timer being configured to generate a periodic clock signal, including a monitoring arrangement to monitor a pulse duration of the periodic clock signal, including:
   a monitoring arrangement, which is a hardware watchdog, to monitor a pulse duration of the periodic clock signal, which includes a counter for detecting the pulse duration; and
   a reference timer to operate the counter;
wherein the pulse duration is the time which elapses between a rising edge and a falling edge of the periodic clock signal,
wherein the counter is clocked with the reference timer and detects the pulse duration between the rising edge and the falling edge of the periodic clock signal to be monitored, and
wherein if the content of the counter lies outside of the monitoring band for the pulse duration, then the blocking signal is output to block the safety-relevant function, since the pulse duration of the timer is incorrect.

12. A device for monitoring a timer, which is configured to generate a periodic clock signal, comprising:
   a monitoring arrangement to monitor a pulse duration of the periodic clock signal, wherein the apparatus includes a counter for detecting the pulse duration;
   wherein the counter for detecting the pulse duration includes a reference capacitor coupled to at least one window comparator, and wherein the at least one window comparator is for comparing a charging level of the reference capacitor with at least one reference voltage, and
   wherein the pulse duration is the time which elapses between a rising edge and a falling edge of the periodic clock signal.

* * * * *